United States Patent [19]
Frey

[11] Patent Number: 5,753,531
[45] Date of Patent: May 19, 1998

[54] METHOD FOR CONTINUOUSLY MAKING A SEMICONDUCTOR DEVICE

[75] Inventor: Jeffrey Frey, Chevy Chase, Md.

[73] Assignee: The University of Maryland at College Park, College Park, Md.

[21] Appl. No.: 660,190

[22] Filed: Jun. 3, 1996

Related U.S. Application Data

[62] Division of Ser. No. 353,206, Dec. 1, 1994, Pat. No. 5,563,095.

[51] Int. Cl.⁶ .................................................. H01L 21/22
[52] U.S. Cl. ........................ 438/61; 438/62; 438/484; 438/907
[58] Field of Search ........................... 438/62, 484, 490, 438/907, 61

[56] References Cited

U.S. PATENT DOCUMENTS

| | | | |
|---|---|---|---|
| 3,279,964 | 10/1966 | Beck | 148/189 |
| 3,511,703 | 5/1970 | Peterson . | |
| 3,667,989 | 6/1972 | Keating . | |
| 3,790,404 | 2/1974 | Garnache et al. . | |
| 4,227,291 | 10/1980 | Schumacher . | |
| 4,410,558 | 10/1983 | Izu et al. . | |
| 4,438,723 | 3/1984 | Cannella et al. . | |
| 4,478,880 | 10/1984 | Belouet . | |
| 4,485,125 | 11/1984 | Izu et al. . | |
| 4,643,627 | 2/1987 | Bednorz et al. . | |
| 4,664,939 | 5/1987 | Ovshinsky . | |
| 4,681,654 | 7/1987 | Clementi et al. . | |
| 4,728,406 | 3/1988 | Banergee et al. . | |
| 4,786,616 | 11/1988 | Awal et al. | 117/85 |
| 4,789,645 | 12/1988 | Calviello et al. . | |
| 4,951,601 | 8/1990 | Maypan et al. | 204/298.25 |
| 5,019,233 | 5/1991 | Blake et al. | 204/298.25 |
| 5,043,299 | 8/1991 | Chang et al. | 438/674 |
| 5,186,594 | 2/1993 | Toshima et al. | 118/719 |
| 5,256,562 | 10/1993 | Vu et al. . | |
| 5,266,116 | 11/1993 | Fujioka et al. | 118/718 |
| 5,386,798 | 2/1995 | Lowndes et al. | 117/104 |

FOREIGN PATENT DOCUMENTS

63-13323  1/1988  Japan ......................... 437/248

OTHER PUBLICATIONS

Atherton, R.W., et al, "Performance Analysis of Multi-Process Semiconductor Manufacturing Equipment," *Abs.* 1990 Proceedings, Advanced Semiconductor Mfg Conference and Workshop.

Beni, G., et al, "Vacuum Mechatronics," In Introduction to Vacuum Mechatronics, Chapter 1, Center for Robotic Systems in Microelectronics, Univ of Cal, Santa Barbara, California. Date unknown.

Ehrlich, D.J., et al, "Emerging Technology for in situ Processing: Patterning Alternatives," *J. Vac. Sci. Tech.* B6(3):May/Jun. 1988.

Gamo, K, "Focused Ion Beam Technology," *Vacuum* 42(1&2):89-93 (1991).

Gamo, K., "Ion Beam Microfabrication," *Vacuum* 44(11&12):1089-1094 (1993).

Harriott, L.R, "In situ Processing of Semiconductors," *Materials Science and Engineering*, B14:336-345 (1992).

Hayashi, T., et al, "High Performance Scaled Flash-Type EEPROMs Fabricated by in situ Multiple Rapid Thermal Processing," *Electronics Letters* 29(25):2178-2179 (1993).

(List continued on next page.)

*Primary Examiner*—Kevin Picardat
*Attorney, Agent, or Firm*—Hunton & Williams

[57] ABSTRACT

A method of continuous manufacture of semiconductor integrated circuits, said method and apparatus adapted to contain the semiconductor substrate, semiconductor deposition coating processes, and etching processes within a substantially collocated series of process chambers so that the semiconductor travels from one chamber to the next without exposure to airborne impurities and contact with manufacturing personnel. The invention has particular utility in the high volume fabrication of large surface area semiconductor circuits such as active matrix liquid crystal displays. The present invention contains a roll-to-roll and continuous belt embodiment.

14 Claims, 6 Drawing Sheets

OTHER PUBLICATIONS

Larrabee, G.B., "The Intelligent Microelectronics Factory of the Future," *Abs.* 1991 Proceedings, Int'l Semiconductor Mfg. Sci. Symp.

Petroff, P.M., et al., "Nanostructures Processing by Focused Ion Beam Implantation," *J. Vac. Sci. Technol.* B9(6):Nov./Dec. 1991.

Rubloff, G.W., "Maskless Selected Area Processing," *J. Vac. Sci. Technol* B7(6):Nov./Dec. 1989.

Rudder, R.A., et al., "Development of an Ultrahigh Vacuum, in vacuo Wafer Transfer Facility Integrated Processing," *J. Vac. Sci. Technol* A7(8):May/Jun. 1989.

Shirazi, M., et al., "Vacuum Mechatronics and Self-Contained Manufacturing for Microelectronics Processing," 7th IEEE/CHMT Int'l Electronic Mfg Tech. Symp., Sep. 1989.

Steckl, A.J., "Particle–Beam Fabrication and In Situ Processing of Integrated Circuits," Proceedings of the IEEE, vol. 74, No. 12, Dec. 1986.

Wood, S., et al., "Configuration and Management Strategies for Cluster–Based Fabs," *Abs.* 1993 Proceedings, International Semiconductor Manufacturing Science Symposium.

Yamada, I., "Advanced Ion Beam Processing Projects in Japan," *Nuclear Instruments and Methods in Physics Research* B59/60 1467–1475 (1991).

METHOD FOR CONTINUOUSLY MAKING A SEMICONDUCTOR DEVICE

This application is a Division of U.S. patent application Ser. No. 08/353,206 filed on Dec. 1, 1994, now U.S. Pat. No. 5,563,095.

FIELD OF THE INVENTION

This invention relates generally to a method and apparatus for the continuous fabrication of semiconductor devices of the type which have been subjected to deposition, etching and/or doping processes which convert material into useful electronic structures. More particularly the present invention provides two methods of continuous manufacture of semiconductor integrated circuits. The first method provides a supply roll of semiconductor substrate ribbon that passes sequentially from one modular process to another without exposing the semiconductor substrate ribbon to atmospheric contaminants between the processing stages. The modular processes are contained within a common processing chamber or in sequential chambers. The second method provides a continuous belt with semiconductor wafer holders. The belt is loaded with semiconductor substrate wafers at a loading area. The belt then guides the wafers sequentially from one modular process to another without exposing the wafer to atmospheric contaminants between stages. The wafers may then be unloaded in a collection area. The invention, as disclosed herein, is most specifically adapted for use in the manufacture of semiconductor devices in large quantities and where atmospheric contaminants can greatly affect the process yield. In addition to its use for manufacture of such standard silicon devices as Dynamic Random Access Memories (DRAMs) and Microprocessor Units (MPUs), the basic technique of the present invention can be applied to the manufacture of Liquid Crystal Displays (LCD) and devices based on materials such as gallium arsenide and indium phosphide.

BACKGROUND OF THE INVENTION

Current techniques for large scale production of integrated circuits start with a single large and flat semiconductor substrate. For conventional integrated circuits, this substrate, or "wafer," is a disc of single-crystal silicon, currently up to 200 mm in diameter. In the case of a conventional active matrix liquid crystal display (AMLCD) panel, the substrate is a thin layer of amorphous, polycrystalline, or single-crystal silicon on a transparent substrate. Both conventional integrated circuits and displays use multiple processes to locally change the properties of the semiconductor material. The local changes form electronic component structures and interconnections between structures to create a complete integrated circuit. The conventional manufacturing technique uses a photographic process to sequentially expose patterns onto the wafer. The patterns define the localities on the wafer where properties are to be modified. This conventional method can be used to etch metals, insulators or semiconductor material; deposit metals, insulators, or semiconductor material; and locally dope these materials with impurities, to define the local structure of the wafer. The repeated coordinated exposure of the wafer to different patterns allows the conventional photographic process to define where each process will have effect. The conventional photographic process uses a light-sensitive masking material on the surface of the semiconductor substrate. In localized doping, for example, depending on the light sensitive masking material used, the part of the substrate surface which was either exposed or masked from light would receive a deposit of a chemical dopant. This photographic, or masking, process can be repeated, using various dopants, until the desired integrated circuit is formed. Each masking process is coordinated with the prior masking process to align the multiple layers of semiconductor material to form three dimensional electronic components and interconnections. This conventional technique has been successfully adapted to doping the semiconductor by ion implantation or diffusion, to etch the semiconductor, insulator, or conducting layers previously deposited on the substrate, and to selectively deposit new materials. After processing, the conventional semiconductor wafer is cut into individual integrated circuits.

As used in the prior art, the conventional masking or photographic process has certain limitations for the rapid manufacture of very large quantities of devices, and is a very expensive method of manufacturing small quantities of many different types of devices. In addition, the conventional process exposes wafers to possible contamination. First, the conventional photographic process requires the use of optical masks which must be custom-made for each type of device. Optical masks are expensive to make and once made can only produce one particular type of circuit. Second, the conventional processes are applied as a series of discrete process stages where single wafers must be moved from process to process. The handling of the wafers between process stages exposes the wafers to atmospheric contaminants and other possible damage and also consumes factory time. The interprocess transportation of wafers and unavoidable exposure to atmospheric contaminants is especially damaging to large semiconductor devices, such as AMLCDs.

The conventional photographic technique can be used to create structures on large surface area devices. However, to overcome optical limitations, some of the conventional masking processes only expose partial sections of the substrate surface. The partial exposure technique requires the different exposed sections be "stitched" or "stepped" together until the entire substrate surface is exposed. The partial exposure method requires special electronic and mechanical apparatus to assure that the stitching occurs with the required accuracy. While the conventional partial exposure technique can be used to fabricate large surface area semiconductors, the stitching process adds to the semiconductor production cost because it reduces manufacturing throughput. This method suffers from many of the same disadvantages as the conventional photographic process. The partial exposure process does not obviate the manual transportation of wafers between processing stages. As in the single conventional mask method, the interprocess transportation exposes the wafer to contaminants and possible damage.

There exist methods and apparatus, such as U.S. Pat. No. 4,728,406 to Arindam Banerjee, et al., issued on Mar. 1, 1988 to increase manufacturing throughput by continuously manufacturing high volumes of large area thin film solar cells by plasma deposition. Other bulk deposition methods and apparatus as taught in, U.S. Pat. No. 4,438,723 to Vincent D. Cannella, et al., issued Mar. 27, 1984; U.S. Pat. No. 4,485,125 to Masatsugu Izu et al., issued on Nov. 27, 1984; and U.S. Pat. 4,664,939 to Herbert Ovshinsky, issued May 12, 1987, exist that continuously manufacture large area thin film cells. Such techniques were developed to produce high volumes of solar cells. The methods disclosed are for continuously depositing semiconductor material onto a metal foil. These methods may be useful for the fabrication of supply material for the present invention and are herein incorporated by reference. Such methods, however, do not teach or suggest any method of continuous manufacture and formation of discrete electronic structures of the type required for DRAMS, MPUs, and AMLCDs.

There exists a method of fabricating polycrystalline silicon strips by depositing on the top face of a carbon ribbon a layer of silicon and burning away the carbon ribbon supporting the silicon layer immediately following deposition of the silicon. Such a method is disclosed in U.S. Pat. No. 4,478,880 to Christian Belouet, issued Oct. 23, 1984. This patent discloses a process to manufacture a continuous strip of silicon semiconductor substrate.

There exist methods, such as U.S. Pat. No. 4,681,654 to Calviello et al., issued Dec. 6, 1988, that disclose a continuous manufacturing process for semiconductor chip packaging. The disclosed method shows that integrated circuits can be packaged into plastic or ceramic "chip" packages using a continuous process.

There exist methods and apparatus, such as U.S. Pat. No. 4,227,291 to John C. Schumacher, issued Oct. 14, 1980, that disclose a process for continuous production of an elemental semiconductor matrix with a partial recovery of the energy expended in the production process. The method is used to manufacture solar cells and recover energy from the manufacturing process.

There exist systems, such as U.S. Pat. No. 5,256,562 to Duy-Phach Vu et al., issued Oct. 26, 1993, that disclose a discrete method for fabricating active matrix displays by using a thin film transfer process to remove tiles of circuits (formed in silicon thin films) and transferring, locating and adhering the removed tile to a common module body.

There exist systems, such as U.S. Pat. No. 4,789,645 to Calviello et al., issued Dec. 6, 1988, that disclose a discrete method of manufacturing monolithic microwave integrated circuits from the top down. This method discloses that a monolithic microwave circuit can be fabricated in the discrete steps of depositing semiconductor material and etching parts of the material to leave a useful structure as the remainder. The disclosed fabrication method uses conventional photographic techniques to form novel circuit structures.

There exist systems, such as U.S. Pat. No. 3,790,404 to Richard R. Garnache et al., issued on Feb. 5, 1974, for an apparatus for effecting uniform and continuous mass transport reactions, such as oxidation, diffusion and etching between gaseous phase reactants and semiconductor substrates. The disclosed apparatus is a longitudinal process tube with an entrance zone and exit zone that can be used to uniformly produce unprocessed semiconductor wafers.

There exist systems, such as U.S. Pat. No. 3,667,989 to J. M. Keating, issued on Jun. 6, 1972, that disclose a method for selectively coating a discrete transistor component while crudely masking the transistor flange in order for the packaging material to adhere to the flange and seal the transistor.

It is one objective of the present invention to overcome the throughput limitations of current manufacturing methods for integrated circuits, by replacing the sequential handling of single substrates or wafers by a continuous process with greater throughput.

It is a further objective of the present invention to replace separate processing machines with a single continuous-flow machine in which processes are performed sequentially to overcome the problem of production failures due to dust and other local contamination by reducing or eliminating the need to transport substrates-in-process between processing stations.

It is a further objective of the present invention to use a direct energy beam manufacturing method in conjunction with a continuous manufacturing process. These and other advantages of the instant invention will be apparent from the brief description, the drawings and the detailed description thereof which follow.

BRIEF SUMMARY OF THE INVENTION

Generally the present invention provides a method and apparatus for producing semiconductor integrated circuits at low cost. One example of a circuit which could immediately benefit from the use of the disclosed inventive manufacturing method is a microprocessor circuit. The present invention may be applied to large sensor arrays and displays and other types of semiconductor circuits as well. Moreover, the present invention may also be applied to circuits of any surface area, depending on substrate availability, and is useful with a plurality of materials such as gallium arsenide and indium phosphide. The present invention may also be applied to the production of large surface area devices to increase production yields.

The present invention is a method of continuous manufacturing of semiconductor devices by sequential processing wherein the sequential processes are sufficiently isolated from one another to execute the particular process stage while the continuous manufacturing technique, as a whole, isolates the semiconductor devices from external contaminants and handling.

The present invention is a continuous manufacturing apparatus with a method for providing a continuous supply of semiconductor substrate and a central environmentally controlled processing apparatus that contains a series of processing modules wherein each processing module may support an independent operating environment. The present invention feeds a supply of continuous semiconductor material, or other material suitable as a substrate for semiconductor material, into the continuous manufacturing apparatus, or a continuous series of individual wafers or substrates into the apparatus. The apparatus then feeds the semiconductor material or substrates through the series of modular processes required to form a particular integrated circuit. The processes within the apparatus may be isolated from one another so that each process may occur in its own operating environment. The apparatus as a whole isolates the semiconductor material from external contaminants and eliminates the handling of semiconductor substrates between processes. The present invention uses at least one directed energy beam process to form useful structures on the semiconductor substrate. After all the required processes are complete, the apparatus feeds the semiconductor material or individual substrates, now formed with partially or fully processed semiconductor structures, into a collection area. The elimination of interprocess handling and the continuously isolated processing method of the present invention can greatly increase manufacturing efficiency and product yields.

The present invention is the method for creating and processing a continuous supply of semiconductor substrate. The continuous supply of semiconductor substrate has two embodiments. The first embodiment uses a roll of semiconductor substrate ribbon to supply the manufacturing apparatus. The second embodiment uses a continuous loop belt with semiconductor wafer holders to supply the manufacturing apparatus. In the first embodiment, a ribbon of semiconductor substrate material is coiled around a drum to form a supply roll. The overlaying layers of semiconductor substrate ribbon on the roll may be protected from one another with a separating material. The separating material may protect the rolled semiconductor substrate from physical and electrical damage or contamination.

The semiconductor substrate supply roll may be formed by several methods. In the first method a flexible film is used to provide the base support. An adhesive layer is applied to the flexible film and semiconductor wafers are affixed to the adhesive layer. The flexible film and semiconductor wafers are then wrapped around a drum. The drum has a diameter sufficient to minimize the bending of the somewhat brittle semiconductor wafer. To minimize the effects of bending, the wafers adhered to the film may be cut or cleaved along lines parallel to the drums axis with a laser beam normal to the ribbon surface. These cuts may be made along the lines where the individual integrated circuits will be separated upon the completion of all processes. The cuts may provide flexible relief for the semiconductor substrate when the substrate is wrapped around the processing drum. Another method of forming the semiconductor substrate supply roll, is to use a semiconductor material which is flexible enough to be wrapped around the drums. Such flexibility may be achieved in an organic semiconductor material. In this case cleaving is not necessary to provide flex relief, but, cleaving may still be used to provide physical and electrical isolation between finished integrated circuits.

The semiconductor substrate ribbon is threaded into the continuous manufacturing apparatus. The threading may be accomplished by an automatic threading mechanism or manually by the partial disassembly of the processing modules. The semiconductor substrate roll may have a leader to facilitate the threading of the continuous manufacturing apparatus. The semiconductor substrate ribbon is threaded through the manufacturing apparatus and onto a collection drum. The collection drum may be threaded with a separating material to protect the now formed or partially formed integrated circuits from physical, electrical and contamination damage.

In the second embodiment of the present invention the continuous roll of semiconductor substrate ribbon is replaced with a continuous loop belt with holders designed to hold semiconductor substrate wafers. The holder embodiment has the additional steps of loading and unloading semiconductor wafers into and out of the holders. It is understood that both manual and automatic loading and unloading of semiconductor wafers into and out of the holders is within the scope of the present invention. Moreover, the holders may be small enough to hold a single conventional integrated circuit or large enough to hold very large surface area substrates.

The continuous manufacturing apparatus has at least one process that uses a directed energy beam to form useful structures on the semiconductor substrate. The directed energy beam may be used in a number of configurations. A first configuration uses the directed energy beam to dope, or introduce chemical impurities, into the semiconductor substrate. In this configuration, the directed energy beam would be formed of charged ions of dopant or other impurity material. A second configuration uses the directed energy beam to facilitate a chemical reaction, such as etching or oxide growth, at the surface of the substrate. The chemical reaction may be over the entire surface of the substrate or locally defined. In this second configuration, the energy beam may be a high-energy laser beam of proper wavelength to heat the substrate and/or to facilitate the chemical reaction process, which may be sensitive to the frequency, as well as the amplitude, of laser illumination. A third configuration uses the directed energy beam to etch the substrate by sputtering away particles from that surface in the process known as ion milling. In this third configuration, the directed energy beam may use inert ions, such as argon. A fourth configuration uses a directed energy beam in a reactive atmosphere to chemically etch the semiconductor material. This process is called reactive ion beam etching. For example, etching gallium arsenide, in this beam configuration, uses an ionic chlorine beam in a gaseous environment of molecular chlorine. A fifth beam configuration, uses a layer of dopant material suspended or affixed on the substrate surface. The material may be locally driven into the surface of the substrate by the action of a direction energy beam. The directed energy beam may be ions of the material which is to be driven into the substrate.

The continuous manufacturing apparatus may have a generally circular configuration and be adapted to receive modular processing stages. It is understood that the circular configuration has a large enough diameter to sufficiently minimize any distortion of substrate material brought about by the curved surface. It is understood that a linear, i.e., straight line, or other configuration for the motion of substrate material and the arrangement of process modules is within the scope of the present invention. The continuous manufacturing apparatus' modular design may be used to standardize the means for physically securing a particular processing stage to the apparatus. This gives maximum flexibility to the apparatus for improvements and changes to the processing modules. For example, the first processing stage may be a thermal oxidation stage that requires the semiconductor substrate to be raised to a specific temperature and exposed to an oxidizing agent for a particular length of time so that an oxide layer may slowly grow on the substrate. In this example, a single modular processing chamber may be too small, when considering the speed of the semiconductor substrate movement, to provide enough time to accomplish the thermal oxidation process. In that case more than one modular processing chamber may be used, in conjunction with an appropriate heat application, to accomplish the thermal oxidation process without reducing the apparatus throughput. It is understood that the modular processing chambers may have a standard configuration for physically attaching different processing elements, and a standard configuration for attachment to the overall processing chamber. However, it is within the scope of the present invention that each modular process may be uniquely configured for size, shape and length as required.

The present invention may use directed beam etching, deposition and doping methods to form electrical component structure and component interconnections on or in the semiconductor substrate. The process is performed in stages comprising a localized or general doping stage, an insulator, semiconductor or metallic deposition stage and a directed beam etching, e.g., removal of the deposited material stage. An appropriate sequence of repeated doping, deposition and beam etching processes may be used to form the desired circuit structures and a complete integrated circuit.

In a variation of the directed beam process, the directed beam is used to deposit semiconductor or metallic material locally on the semiconductor substrate, rather than to etch this material to the desired pattern. This process may be performed by using a beam of ions or photons, in a chemical atmosphere containing the material to be deposited, or by covering the semiconductor material with a suspended material and affixing the material into precision structures with a directed energy beam, and then washing away or evacuating the non-affixed material with, for example, corrosive or abrasive wash.

It is understood that the directed beam embodiments may use a raster or vector scan. A raster scan sweeps the beam in a standard raster or zig-zag pattern over the substrate surface. The raster beam may be intensity modulated for either digital, i.e., on-off, or with continuous analog intensity variations. The vector scan allows the beam to move directly from coordinate to coordinate on the substrate surface. The vector scan may also be digitally, i.e., on-off, or continuous analog intensity modulated. The beam may also be power modulated, e.g., frequency and/or duty cycle modulated, to effect the desired local structures.

BRIEF DESCRIPTION OF THE DRAWING

FIG. 4 shows one-fourth of the processing drum, the flexible film base, the adhesive layer, and the affixed semiconductor material.

FIG. 5 is a cross-sectional view of a second embodiment of the continuous semiconductor processing apparatus that includes a loading air lock, a loading area, a continuous loop belt with wafer holders, a gate oxide deposition process, a polycrystal deposition process, a first resist spray, a first resist bake, a gate mask write process, a spray develop process, a poly silicon etch process, an oxide removal process, a first implantation process, an implantation anneal process, a resist removal, a metal deposition, a second resist spray, a metal pattern write, a second resist bake, a spray develop and a metal pattern etch process, a take-up drum and an interlayer protective film supply drum, surrounded by a vacuum chamber, a main processing drum. The particular process embodiment shown in FIG. 6 is based on the sequence for ordinary metal oxide semiconductor (MOS) integrated circuit (IC) production using the directed energy beam and continuous manufacturing method of the present invention.

FIG. 7 shows one fourth of the processing drum, the continuous loop belt, semiconductor wafer holders, and semiconductor wafers.

DETAILED DESCRIPTION

Figure 1:
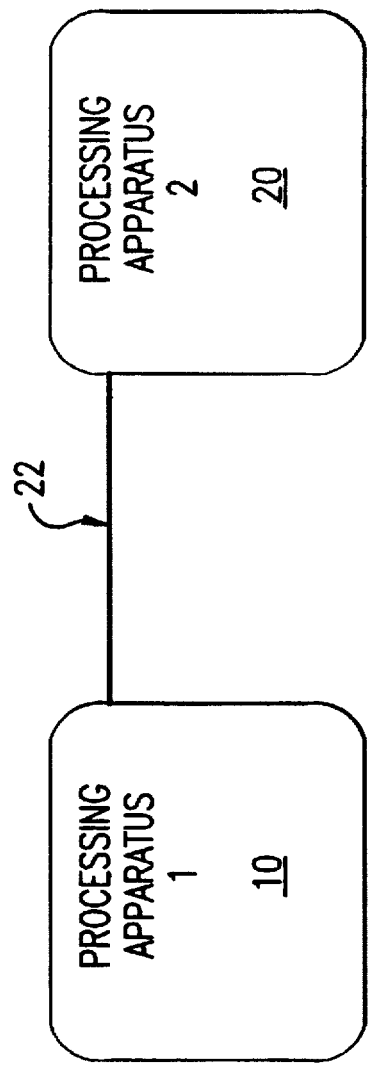
FIG. 1 is a schematic diagram showing the continuous processing apparatus of the present invention in series with another processing apparatus. The diagram depicts the two processing apparatus connected with an airlock tunnel.

Referring now to the drawings and particularly to FIG. 1, a continuous method of manufacturing semiconductor integrated circuits is shown. For clarity, the operation of the invention will be described for the production of ordinary integrated circuits, i.e., circuits in which their final form occupies silicon areas under approximately 10 sq. cm. A feature of the present invention is that numerous IC fabrication processes may be performed serially, using computer-controlled beam techniques, and in a virtually continuous fashion, within a single vacuum process station 10. This method greatly reduces the exposure of the silicon wafers-in-process to contamination from airborne and other particles. When the total number of processes required to manufacture a complete integrated circuit is so large as to make a single vacuum process station 10 impractical for all the processes, sequential vacuum process stations 20 may be used. The silicon ribbon may pass between process stations in a continuous vacuum tunnel 22, may enter and exit stations through air-locks, or the completely wrapped roll of partially processed silicon ribbon may be manually moved from one chamber to another.

Figure 2:
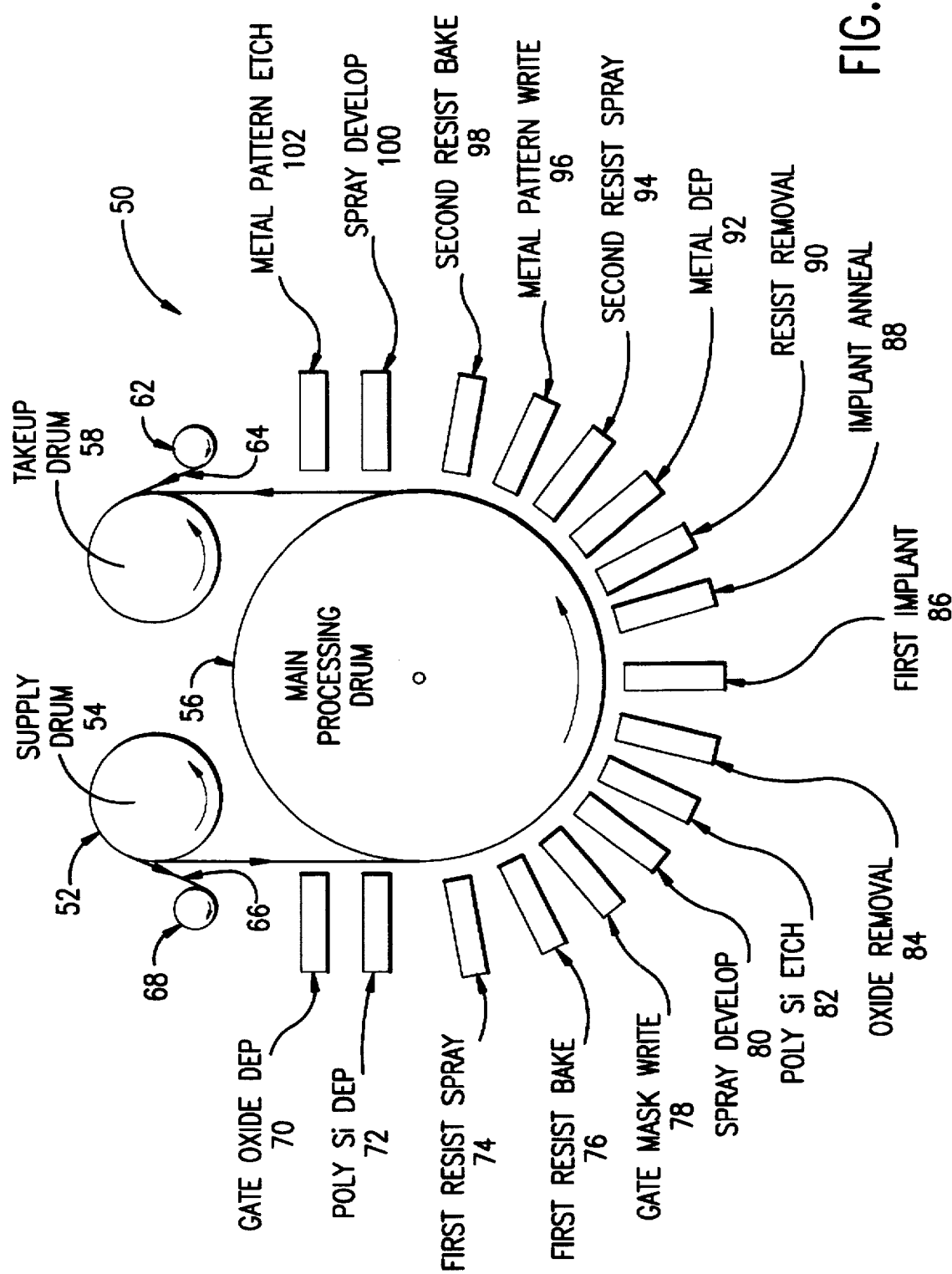
FIG. 2 is a cross-sectional view of one embodiment of the continuous semiconductor processing apparatus that includes a supply drum, an interlayer insulator take-up drum, a silicon ribbon, a gate oxide deposition process, a polycrystal deposition process, a first resist spray, a first resist bake, a gate mask write process, a spray develop process, a poly silicon etch process, an oxide removal process, a first implantation process, an implantation anneal process, a resist removal, a metal deposition, a second resist spray, a metal pattern write, a second resist bake, a spray develop and a metal pattern etch process, a take-up drum and an interlayer protective film supply drum, surrounded by a vacuum chamber, and a main processing drum. The particular process embodiment shown in FIG. 2 is based on the sequence for ordinary metal oxide semiconductor (MOS) integrated circuit (IC) production using the directed energy beam and continuous manufacturing method of the present invention.

FIG. 2 shows the present invention in a simple configuration for fabricating elementary metal-oxide-semiconductor (MOS) integrated circuits. It is understood, however, that much more complex process configurations are within the scope of the present invention. The silicon material in the form of a thin continuous single-crystal film 52 is wound onto a supply drum 54. The silicon substrate, which will hereinafter be called the "silicon ribbon," is then wrapped around the main processing drum 56 and on to a take-up drum 58. At the beginning of the process a "leader ribbon" may be used to accomplish this initial threading. Depending upon the state of processing after it has been wrapped around the main processing drum 56, the surface of the silicon ribbon 52 may be protected on the take-up drum 58; if so, an interlayer protective film 64 may be fed on to the take-up drum 58 from an insulating layer supply drum 62 as the silicon ribbon 52 is simultaneously wound on take-up drum 58. An interlayer film 64 thus applied may provide an additional function such as, a surface protectant for the overall chip, a dielectric layer facilitating additional layers of metal, a source of dopant, and/or to remove particle contamination by use of a particle-retaining adhesive. In multiple-chamber realization of this invention, if a silicon ribbon 52 with an interlayer protective film 66 is supplied to the chamber on supply drum 54, the protective film 66 may be removed as the ribbon is wound onto the main processing drum 56 by wrapping around the interlayer film take-up drum 68.

Once the ribbon is threaded onto the drums 54, 56 and 58 as shown, it undergoes a series of processes at: gate oxide deposition 70; poly silicon deposition 72; first resist spray 74; first resist bake 76; gate mask write 78; spray develop 80; poly silicon etch 82; oxide removal 84; first implant 86; implant anneal 88; resist removal 90; metal deposition 92; second resist spray 94; metal pattern write 96; second resist bake 98; spray develop 100; and metal pattern etch 102. For the simple MOS manufacturing process shown in FIG. 2, where the silicon ribbon 52 supplied to the supply drum 54 has already been cleaned and treated in a manner to make it suitable for subsequent fabrication into ICs, the first processing step 70 is gate oxide formation. In the gate oxide formation process 70 a thin layer of high-quality silicon dioxide is deposited or grown over the entire surface of the wafer. A number of methods of such deposition may be applied in this invention, including pyrolysis, use of a volatile carrier gas, or growth by chemical reaction between oxygen and silicon. The oxide may be suspended in a volatile carrier and deposited by spray from a wide nozzle whose spray is as wide as the ribbon or slightly wider; or, for higher quality, the oxide may be thermally grown. In the thermal growth method, a wide area nozzle may be used to introduce oxygen to the surface of the ribbon with the substrate maintained at an appropriate temperature; or a heat producing energy source, e.g., a laser beam, may be locally focused on the ribbon. Sufficient process length, i.e., time, must be allowed for a sufficiently thick oxide to be grown. The oxidation process may be enhanced by scanning the ribbon surface with a laser beam of an appropriate wavelength. Resonant chemical processes may also be used to grow the oxide layer. Resonant chemical processes may be enhanced with exposure to laser beams at an appropriate frequency. It is understood that the supply of silicon material may pause or stop at any stage during the continuous processing. This may be accomplished with a stepping motor.

At the second process station 72 polycrystalline silicon is deposited uniformly on the ribbon. Polycrystalline silicon may be dissolved in a suitably volatile carrier and sprayed onto the ribbon, or may be deposited as a result of surface chemical reaction using a silicon-containing gas.

The next process step 74 sprays a uniform layer of photo or electron-beam resist on the ribbon. The resist layer is used to form the gate pattern for the MOS transistors by making the areas on the wafer impervious to a subsequently applied global etching process.

Processing step 76 bakes the resist layer, deposited at processing step 74, to improve the resist material's protective properties. Baking or heating of the surface of the ribbon coated with the resist can be accomplished in a number of ways: Heat may be applied to the inside surface of the ribbon with a heater in the main processing drum; and/or heat may be applied from the front or back surface using a flash lamp, heating element, or scanned laser beam.

The next process step 78 delineates a pattern for the gate oxide over selected regions of the wafer. The MOS fabrication example shown in FIG. 2 uses an electron beam to delineate a gate oxide pattern at step 78, although a laser beam may alternatively be used. The electron beam may be intensity controlled by a digital or analog control signal. The beam may be scanned over the ribbon surface in order to expose the resist in selected regions. The unexposed resist may be removed at the subsequent step 80, leaving the material underneath accessible to any subsequent etching or doping step. Thus, step 78 may delineate precise structures on the silicon ribbon.

Processing step 80 develops the resist pattern from step 78. The development process 80 is performed by spraying a suitable developer, under pressure, on the silicon ribbon surface. The developer removes the resist that was not exposed to the beam in step 78. It is understood that more than one nozzle or other application mechanisms may be used at process step 80. Multiple nozzles or applicators may be used where multiple applications of the same chemical or application of multiple chemicals are required. It is understood that resists which are removed when exposed to a directed-energy beam may also be used at step 80.

Processing step 82 is used to etch a gate pattern into the polycrystalline silicon deposited and prepared at steps 8–13. Etching is accomplished by directing suitable etchant, such as nitric acid, at the ribbon surface. The application of photons (laser light) or heat may be used to accelerate the etching process. It is understood that the etching nozzle may be used to direct a high-pressure fluid flow normal to the surface of the ribbon. A calibrated chemical flow rate and external (e.g., light) excitation may be used in conjunction with the nozzle spray design to achieve well-defined patterns on the polycrystalline silicon.

Processing station 84 may be used to remove the oxide layer from the silicon ribbon in process. Oxide removal may be required in order to form the source and drain implants. Oxide removal may be accomplished by a spray of buffered hydrofluoric acid, by ion milling, or by chemical etching assisted by directed radiation.

Processing step 86 uses a directed energy beam to implant the source and drain structures. The source and drain implant may be localized by using the resist and the polycrystalline silicon gate material as implant masks. Alternatively, a directed beam of ions at the proper energy may be used to locally implant the desired source and drain dopants. Suitable source and drain dopants for silicon are arsenic, boron and phosphorus. The ion beam scan may follow a raster pattern, vector pattern or other patterns.

Processing station 88 anneals the ion implants from station 86 in order to remove damage from the ion implantation. A heat source may be used to effect the annealing process. Heat may be applied by using a heat source within the drum behind the ribbon and/or a laser, flash lamp, heating element, or other heat source directed at the ribbon 52.

The remaining photoresist may be removed by the well-known plasma "ashing" process at station 90. Once again, this process will require introduction of the appropriate atmosphere, in gaseous form, and a source of energy to facilitate the reaction.

The next step in this exemplar MOS fabrication procedure is deposition of metal for contacting and interconnection layers at step 92. Deposition is performed by evaporation from a material source over the surface of the ribbon as station 92. Metal is evaporated and the metal vapors are allowed to condense on the silicon ribbon in process. At stations 94, 96, 98, 100 and 102 lithography and etch steps similar to those described above are performed in order to delineate the metal pattern.

Many variations of the continuous manufacturing process described above are possible. For example, the use of an ion beam whose intensity and energy can be externally controlled can effect ion implantation to selected depths on selected parts of the wafer. By using laser or other energy-containing steerable beams of controllable intensity, it is possible to replace conventional masking techniques. The directed beam method allows discrete areas to be etched by controlling the areas where any chemical process occurs by controlling the intensity and location of the applied beam.

It is understood that a system of baffling or atmospheric isolation between the process steps is within the scope of the present invention. The various processes may require the use of gases or liquids incompatible with other processes. Systems of baffling between process stations, and individual vacuum pumping ports for those processing stations that may need them, may be used to preserve the environment in each processing chamber. For example, if a reactive gas is necessary for one process, a high-capacity vacuum pumping system connected to an extraction port of a shape and size to fit between processing modules may be used to extract remnants of that gas that may exist between two adjacent processing modules. In addition, baffling systems of re-entrant walls may be used to increase the resistance to gas flow from one module to the next.

It will also be seen that combinations and sequences of processes may, in some cases advantageously be combined in a single processing chamber. Also, changes in process for different products, or as technology is developed, are easily accommodated by the modular design. It will also be seen that processes requiring more steps than can be contained in a single chamber may be accommodated by threading the ribbon through an air lock to subsequent chambers, or by physically moving a filled take-up drum to another chamber.

Figure 3:
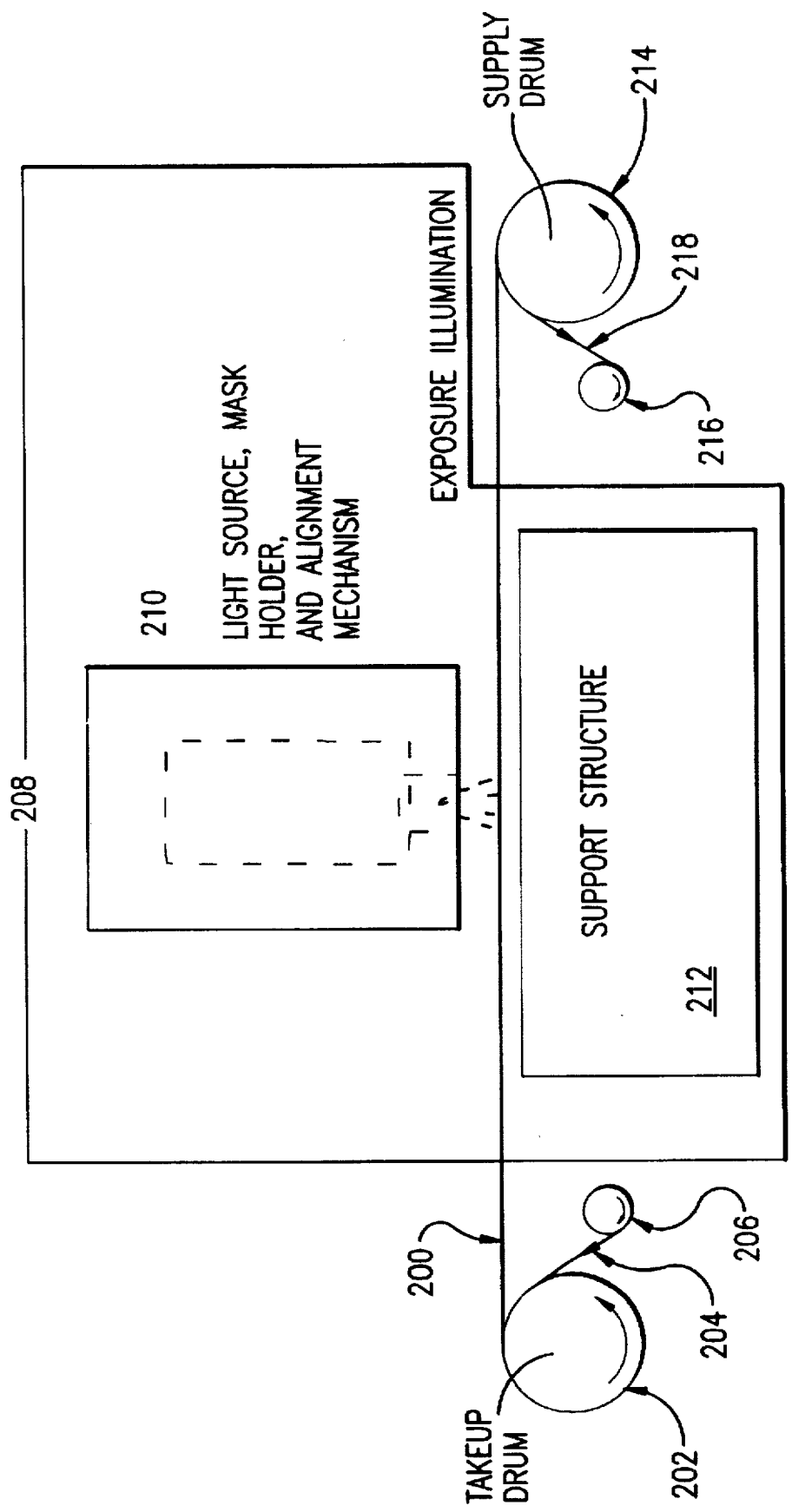
FIG. 3 is a cross-sectional view of a straight line embodiment of the silicon ribbon process of the present invention and a conventional photolithography process adapted for the silicon ribbon. This process has a supply drum for holding the silicon ribbon, a interlayer film take-up drum, a supply of silicon ribbon, a conventional photolithography apparatus with a light source, mask holder, and alignment mechanism, a support structure, a take-up drum, and a interlayer or protective film supply drum.

FIG. 3 is a cross section view of a standard integrated circuit fabrication process adapted receive the silicon ribbon method of the present invention. It will be appreciated by those in the art that not all processing steps required for the production of ICs need be performed using the drum method; rather part of the overall processing sequence may be performed using the method exemplified in FIG. 2, and other processing steps may be performed using conventional techniques, using machines adapted or built to use the silicon ribbon method of material transport. FIG. 3 shows the silicon ribbon 200 initially coiled onto supply drum 214. The ribbon supply may use an interlayer protective film 218. The interlayer protective film 218 may be threaded onto and collected by the interlayer film take up drum 216. Thus, the arrangement of supply drum 214 interlayer film 218, interlayer film take up drum 216, and silicon ribbon 200 provide a method to continuously supply semiconductor material to a conventional IC fabrication process. A conventional IC manufacturing apparatus is represented by 208. The apparatus shown has a light source, mask holder and alignment mechanism 210. The projector subassembly 210 shown is a conventional photolithography process. A support structure 212 is used to support the silicon ribbon 200 during processing by 210. It is understood that the support structure 212 may work in conjunction with the particular process 210 and the silicon ribbon 200 to support and align the fabrication process 208. The silicon ribbon 200 is collected onto take up drum 202. An interlayer protective film 204 may be used to protect the overlapping silicon ribbon 200. The interlayer film 204 may be provided by supply drum 206. An interlayer film 204 may provide an additional function such as, a surface protectant for the overall chip, a dielectric layer facilitating additional layers of metal, a source of dopant, and/or to remove particle contamination by use of a particle-retaining adhesive. Thus, take up drum 202, the interlayer protective film 204, and interlayer film supply drum 206 may be used to continuously collect the processed silicon ribbon. It is understood that the interlayer film, depending on the particular process, may not be necessary to provide a way to continuously collect the silicon ribbon.

Figure 4:
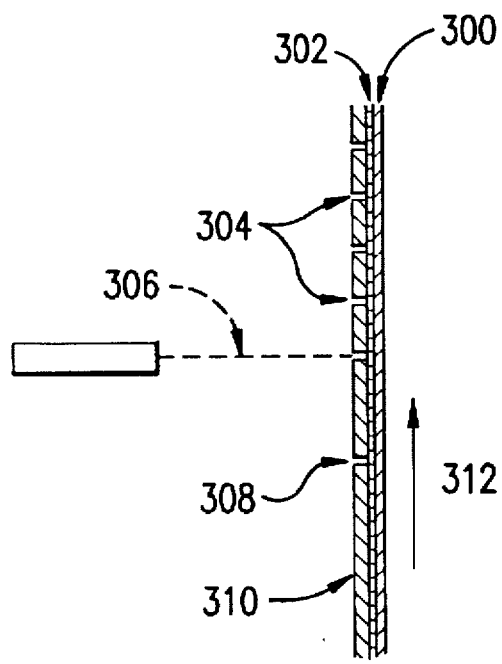
FIG. 4 is a cross sectional view showing the details of the silicon ribbon. The silicon ribbon has a flexible film, an adhesive layer and semiconductor wafers. A laser beam normal to the ribbon surface and scanned in a direction normal to the ribbon motion, makes cuts in the material. The arrow shows the direction of motion of the silicon ribbon relative to the laser beam.

FIG. 4 is a cross sectional view of the flexible semiconductor ribbon. Materials normally used for semiconductor wafers, such as gallium arsenide, silicon and the like are too brittle to be bent around a drum of reasonable size. However, in the conventional fabrication process the wafers once processed are cut up or "diced" into individual chips. One method of dicing the conventional wafer is to adhesively mount the wafer on a flexible film, and then to use a laser to cut through the wafer along the required lines. The individual chips are then accessible individually when the adhesive is removed or the flexible film is dissolved. The present invention may use this process in order to fabricate the silicon ribbon. Individual wafers, which may be discs of material from 50 mm to 300 mm or more in diameter, may be attached to a flexible film 300 and then cut 304 to a square or rectangular shape in order produce a ribbon of semiconductors flexible enough to wrap around a drum of practical size. The ribbon width may be large enough to support a number of smaller wafers. This will give smaller wafer materials such as gallium arsenide, the full speed advantage of the continuous manufacturing process ribbon method. The substrate of the ribbon itself may be a flexible film 300 of insulating material and/or a metal foil which can withstand the temperatures involved in the process. The semiconductor material 310 may be mounted on the flexible film 300 to maintain crystal orientation. One of the directions of the die boundaries 308, which normally is parallel to a crystal plane of the material, may be parallel to the axes of rotation of the drums. A laser 306 may be used to cut the silicon wafer 310.

The semiconductor material which is adhered to the film substrate should be cut along at least one die direction before processing begins. This is different than the sequence in conventional IC fabrication in which all die cutting and separation are the last processing steps before packaging. With the semiconductor material adhered to a flexible substrate and the appropriate die cuts at least in the direction parallel to the drum axes made before processing, the resultant structure will be a ribbon of semiconductor material that is sufficiently flexible to be bent around the drums. The diameters of the drums are large enough to not excessively stress the IC die of the largest size spooled onto the drum. Thus, the cuts in the silicon parallel to axis of the drum rotation is a way to wrap semi-brittle materials onto a supply drum.

It is within the scope of the present invention to use materials other than single-crystal semiconductors such as silicon or gallium arsenide. For example, organic semiconductor materials which may be themselves flexible enough to be wrapped around drums may be processed using this invention. Flexible organic materials may not need to be cut to wrap around a supply drum. Further, large-area ICs, such as AMLCDs, may be made using polycrystalline silicon deposited on suitable flexible films using this technique.

Figure 5:
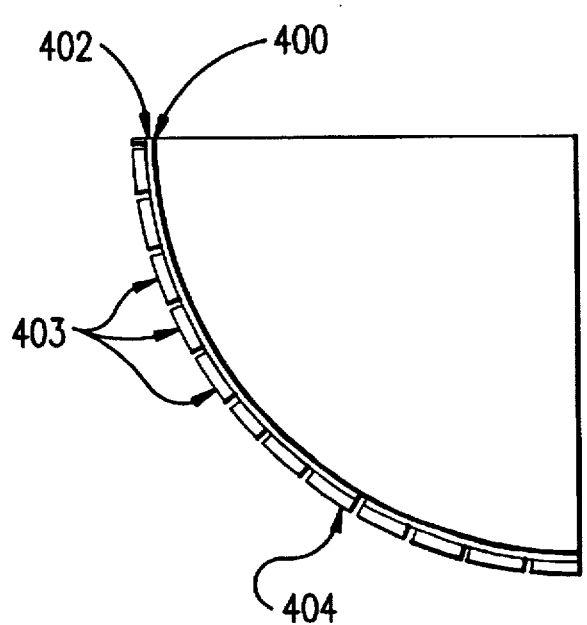
FIG. 5 is a cross sectional view showing the processing drum and the silicon ribbon.

FIG. 5 shows the ribbon created in FIG. 4 wrapped around processing drum 406. The flexible film 400 holds the semiconductor material 404 with an adhesive layer 402. The cuts 403 in the semiconductor material 404 are made parallel to the rotation axis of the processing drum 406. The semiconductor material 404 may have a very large surface area. Thus, the present invention may be applied to the fabrication of large semiconductor devices such as, AMLCDs, sensor arrays, charge coupled devices, (CCDs), and other large surface area devices.

Figure 6:
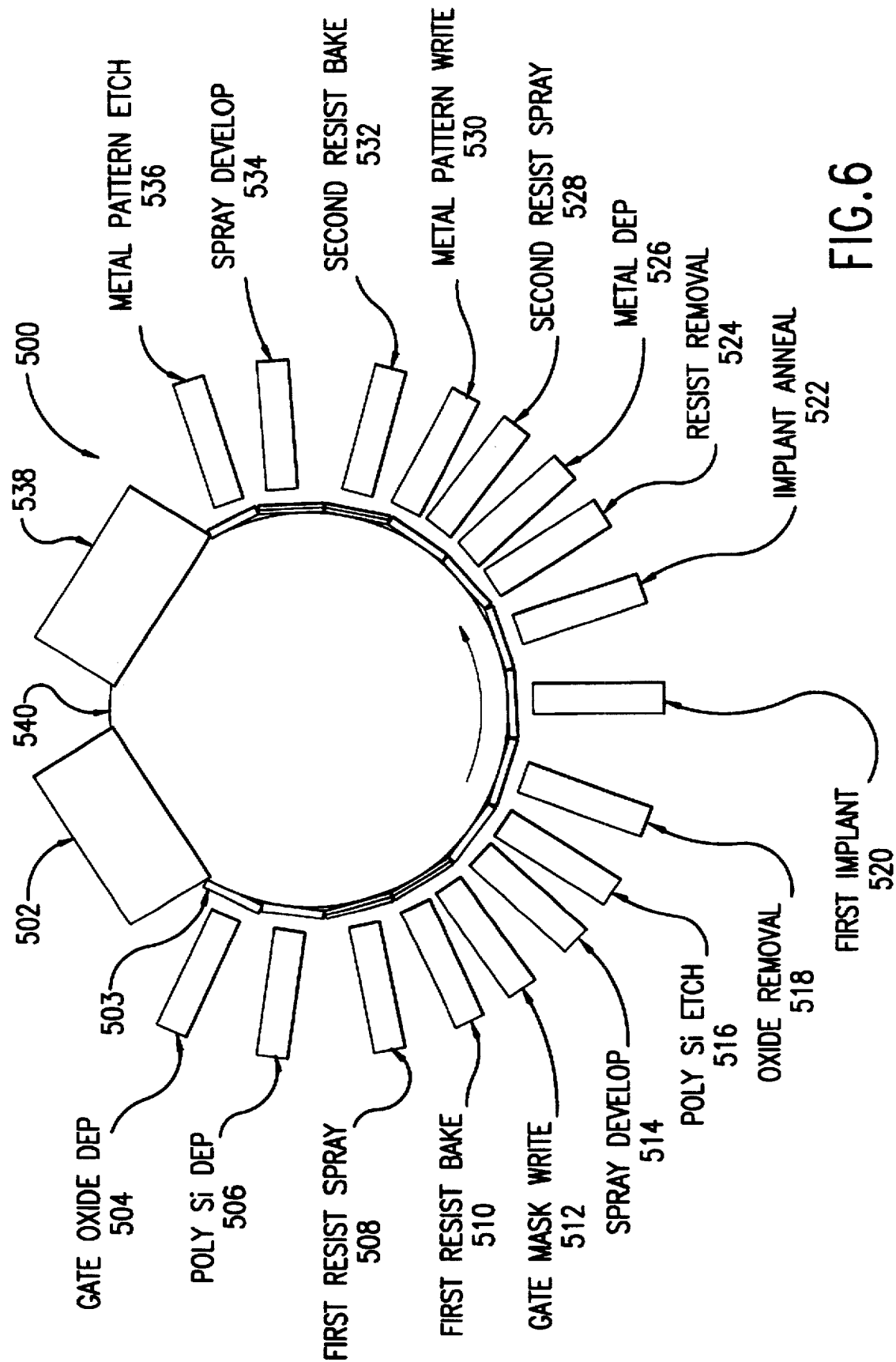
FIG. 6 is a cross sectional view of the continuous manufacturing apparatus adapted to use a continuous loop belt of semiconductor wafer holders, rather than a silicon ribbon.

FIG. 6 is a schematic diagram showing the continuous loop belt embodiment of the present invention. The continuous loop belt embodiment of the present invention is described using a MOS IC fabrication and process sequence. It is understood that the present invention can be configured for much more complex fabrication sequences. The continuous loop belt 503 extends from the wafer loading airlock 502 and to the following processing chambers: gate oxide deposition 504; poly-silicon deposition 506; first resist spray 508; first resist bake; gate mask write 512; spray develop 514; poly silicon etch 516; oxide removal 518; first implant 520; implant anneal 522; resist removal 524; metal deposition 526; second resist spray 528; metal pattern write 530; second resist bake 532; spray develop 534; metal pattern etch 536; to a wafer unloading airlock 538 and then back to the wafer loading airlock 502. The continuous loop belt may use the main processing drum 540 to guide the belt and wafers through the processes. For the simple MOS manufacturing process shown in FIG. 6, where the silicon wafer is loaded in the continuous loop belt 503 has already been cleaned and treated in a manner to make it suitable for subsequent fabrication into ICs, the first processing step 504 is gate oxide deposition. In the gate oxide deposition process 504, a thin layer of high-quality silicon dioxide is deposited over the entire surface of the wafer. A number of methods of such deposition may be applied in this invention, including pyrolysis, use of a volatile carrier liquid, or growth by chemical reaction between oxygen and silicon. The oxide may be deposited by spray from a wide nozzle whose spray is as wide as the wafer or slightly wider; or, for higher quality, the oxide may be thermally grown. In the thermal growth method, a wide area nozzle may be used to spray oxygen onto the surface of the wafer in conjunction with the proper heat directed at the wafer. Sufficient process length, i.e., time, must be allowed for a sufficiently thick oxide to be grown. The oxidation process may be enhanced by scanning the wafer surface with a laser beam of an appropriate wavelength. Resonant chemical processes may also be used to grow the oxide layer. Resonant chemical processes can also be enhanced with exposure to laser beams at an appropriate frequency. It is understood that the continuous loop belt may pause or stop at any stage during the continuous processing. This may be accomplished by driving the drum with a stepping motor.

At the second process station 506 polycrystalline silicon is deposited uniformly on the wafer. Polycrystalline silicon may be dissolved in a suitably volatile carrier and sprayed onto the wafer, or may be deposited as a result of surface chemical reaction using a silicon-containing gas.

The next process step 508 sprays a uniform layer of photo or electron-beam resist on the wafer. The resist layer is used to form the gate pattern for the MOS transistors by making the areas on the wafer impervious to a subsequently applied global etching process.

Processing step 510 bakes the resist layer, deposited at processing step 508, to improve the resist material's protective properties. Baking or heating of the surface of the wafer coated with the resist can be accomplished in a number of ways: Heat may be applied to the inside surface of the wafer with a heater in the main processing drum; and/or heat may be applied from the front or back surface of the wafer using a flash lamp, heating element, or scanned laser beam.

The next process step 512 delineates a pattern for the gate oxide over selected regions of the wafer. The MOS fabrication example shown in FIG. 6 uses an electron beam to delineate a gate oxide pattern at step 512. The electron beam may be intensity controlled by a digital or analog control signal. The beam may be scanned over the wafer surface in order to expose the resist in selected regions. The unexposed resist may be removed at the subsequent step 514, leaving the material underneath accessible to any subsequent etching or doping step. Thus, step 512 may delineate precise structures on the silicon wafer.

Processing step 514 develops the resist pattern from step 512. The development process 514 is performed by spraying a suitable developer, under high pressure, on the silicon wafer surface. The developer removes the resist that was not exposed to the beam in step 512. It is understood that more than one nozzle or other application mechanisms may be used at process step 514. Multiple nozzles or applicators may be used where multiple applications of the same chemical or application of multiple chemicals are required. It is understood that resists which are removed when exposed to a directed-energy beam may also be used at step 512.

Processing step 516 is used to etch a gate pattern into the polycrystalline silicon deposited and prepared at steps 8–13. Etching is accomplished by directing suitable etchant, such as nitric add, at the wafer surface. The application of photons (laser light) or heat may be used to accelerate the etching process. It is understood that the etching nozzle may be used to direct a high-pressure fluid flow normal to the surface of the wafer. A calibrated chemical flow rate and external (e.g., light) excitation may be used in conjunction with the nozzle spray design to achieve well-defined patterns on the polycrystalline silicon.

Processing station 518 may be used to remove the oxide layer from the silicon wafer in process. Oxide removal may be required in order to form the source and drain implants without requiring them to penetrate an oxide layer. Oxide removal may be accomplished by a spray of buffered hydrofluoric acid, by ion milling, or by chemical etching assisted by directed radiation Processing step 520 uses a directed energy beam to implant source and drain structures. The source and drain implant may be localized by using the resist and the polycrystalline silicon gate material as implant masks. Alternatively, a directed beam of ions at the proper energy may be used to locally implant the desired source and drain dopants. Suitable source and drain dopants for silicon are arsenic, boron and phosphorus. The ion beam scan may follow a raster pattern, vector pattern or other patterns.

Processing station 522 anneals the ion implants from station 520 in order to remove damage from the ion implantation. A heat source may be used to effect the annealing process. Heat may be applied by using a heat source within the drum behind the wafer and/or a laser, flash lamp, heating element, or other heat source directed at the wafer.

The remaining photoresist may be removed by the well-known plasma "ashing" process at station 524. Once again, this process will require introduction of the appropriate etching materials, in gaseous form, and a source of energy to facilitate the reaction.

The next step in this simple explanatory MOS fabrication procedure is deposition of metal for contacting and interconnection layers at step 526. Deposition is performed by evaporation from a material source over the surface of the wafer at station 526. Metal is evaporated and the metal vapors are allowed to condense on the silicon wafer in process. At stations 528, 530, 532, 534, 536 and 538 processing steps similar to those described above are performed in order to delineate the metal pattern.

Figure 7:
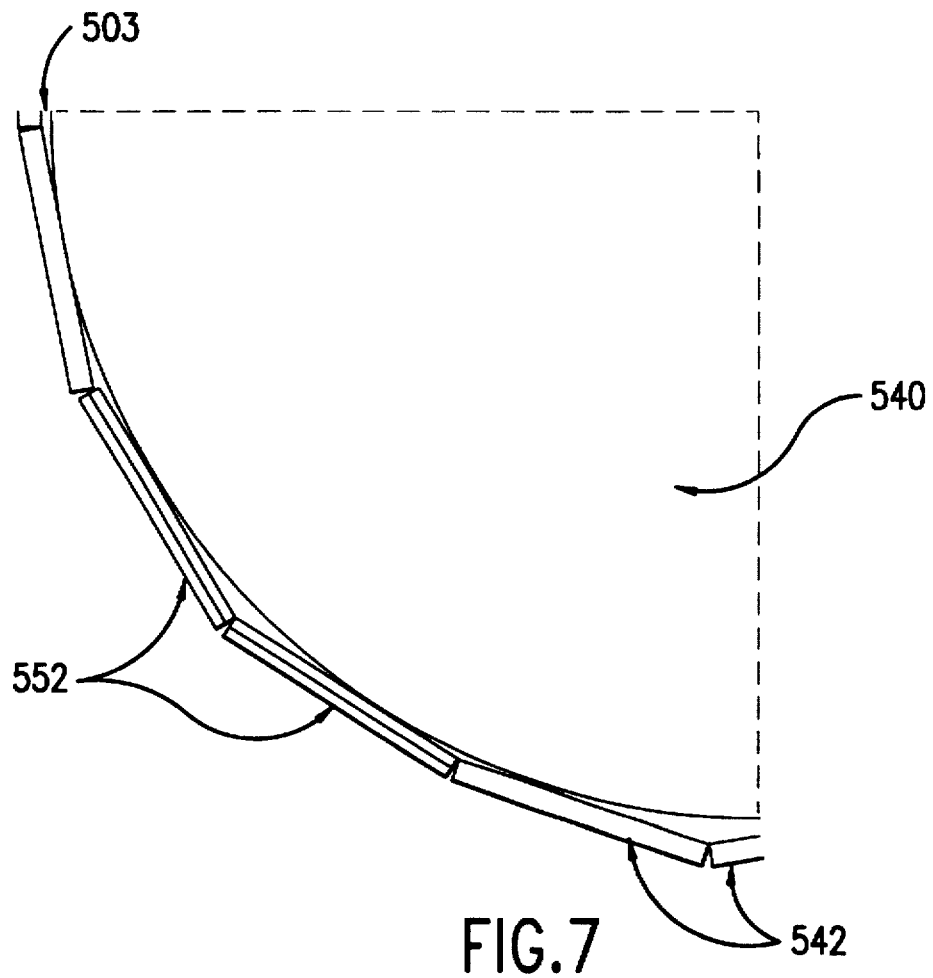
FIG. 7 is a cross sectional view of the processing drum showing the wafer holders.

FIG. 7 is a schematic diagram showing one-fourth of the processing drum 540, the continuous loop belt 503 and the semiconductor wafer holders 542 attached to the continuous loop belt 503. A semiconductor wafer 552 may be loaded into a semiconductor wafer holder 542 by using gravity. It is understood that the wafers 552 may be loaded into the wafer holders 542 by mechanical means, automated means, or by manual means. Likewise, it is within the scope of the present invention that the wafers 552 are unloaded from the wafer holders 542 by mechanical means, automated means, or manual means. The continuous loop belt 503 and wafer holders 542 are a way to provide a substantially continuous supply of wafers to the processing apparatus of the present invention.

Figure 8:
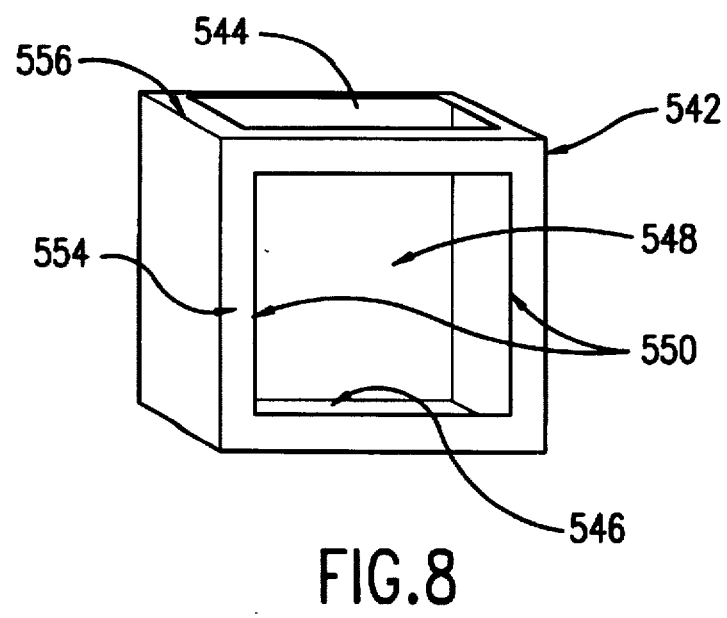
FIG. 8 is a three dimensional view of a wafer holder and shows the structure of the wafer holder isolated from the continuous loop belt. The wafer holder may be generally square shaped, with a flat bottom portion adapted to support a semiconductor wafer, two side panels adapted to laterally support a wafer, and a top side with a rectangular slot adapted to receive a wafer through the slot. The wafer holder is configured to receive a wafer through the top rectangular opening and for the wafer to rest under normal gravity on the bottom side of the wafer holder. The wafer may be held in a specified plane by differential vacuum, spring clips, or other means.

FIG. 8 is a schematic diagram showing a semiconductor wafer holder 542. The wafer holder 542 is generally square shaped. The wafer holder 542 has a bottom 546 adapted to receive and support a semiconductor wafer, two sides 550 adapted to support the sides of a semiconductor wafer, a back side 548 that may expose the underside of the wafer, a front side 554 that exposes the wafer to the processing stages, and an open top piece 556, with a rectangular opening 544 adapted to receive semiconductor wafers. It is within the scope of the present invention that the wafer holder may be nearly any size or shape so long as the wafer holder can securely support a wafer. The wafer may be secured in the wafer holder by means of leaf springs, clips, differential pressure, fasteners, or the like.

While the invention has been particularly shown and described with reference to preferred embodiments thereof, it will be understood by those skilled in the art that various changes in form and details may be made therein without departing from the spirit and scope of the invention as defined by the appended claims.

I claim:

1. A substantially continuous method of manufacturing semiconductor integrated circuits with a roll of semiconductor material threaded through a environmentally controlled process chamber or a plurality of environmentally controlled process chambers comprising the steps of:

affixing semiconductor material onto a flexible film to form a continuous ribbon of semiconductor material;

cutting said semiconductor material with a laser beam that is normal to said flexible film, said laser beam not severing said flexible film, to provide strain relief at said cut to increase the flexibility of said semiconductor material;

winding said flexible film with semiconductor material thereon onto a drum, said drum diameter sufficient to wind said flexible film without damaging said semiconductor material thereon; and conveying said flexible film with semiconductor material deposited thereon to a process station wherein a directed energy beam is directed toward said semiconductor material to either remove said flexible film or said semiconductor material, add additional material to said flexible film or said semiconductor material, or transform a physical property of said flexible film or said semiconductor material in an environmentally controlled process station.

2. The method of claim 1 further comprising the step of: winding an interlayer protective film onto said drum, sandwiching said interlayer protective film in between layers of said semiconductor material formed when wrapping said flexible film with semiconductor material deposited thereon onto said drum.

3. The method of claim 1 further comprising the steps of:

depositing material onto said flexible film or said semiconductor material with a directed energy beam in a first environmentally controlled process chamber;

etching said flexible film, said semiconductor material or said deposited material with a directed energy beam in a second environmentally controlled processing chamber; and doping said flexible film, said semiconductor material or said deposited material with a directed energy beam in a third substantially environmentally controlled processing chamber.

4. The method of claim 3 wherein said depositing step is before said etching step; and said etching step is before said doping step.

5. The method of claim 1 wherein said directed energy beam is an electron beam that scans the semiconductor material.

6. The method of claim 1 wherein said directed energy beam is an ion beam said ion is selected from the group consisting of arsenic, boron, phosphorous or other suitable semiconductor dopants.

7. The method of claim 1 wherein said directed energy beam is an ion beam said ion is selected from the group consisting of $C_2F_6$, $CCL_4$, $BCl_3$ or other suitable semiconductor etchants.

8. A substantially continuous method of manufacturing semiconductor integrated circuits using a continuous loop belt with semiconductor wafer holders mounted thereon to receive semiconductor wafers said method conducted in an environmentally controlled process chamber or a plurality of environmentally controlled process chambers comprising the steps of:

positioning a semiconductor wafer in said wafer holder at a loading area;

transferring said semiconductor wafer from said loading area to a process station by movement of the continuous loop belt;

directing an energy beam toward said semiconductor wafer to either remove semiconductor wafer material, add additional material to said semiconductor wafer, or transform a physical property of said semiconductor wafer material at said process station contiguous with said loading area;

transferring said semiconductor wafer away from said process station to an unloading area by movement of the continuous loop belt; and removing said semiconductor wafer from said wafer holder at said unloading area.

9. The method of claim 8 wherein said directed energy beam is an electron beam that scans said semiconductor wafer.

10. The method of claim 8 wherein said directed energy beam is an ion beam that scans said semiconductor wafer.

11. The method of claim 10 wherein said ion is selected from the group consisting of arsenic, boron, phosphorous, or other suitable semiconductor dopants.

12. The method of claim 10 wherein said ion is selected from the group consisting of $C_2F_6$, $CCL_4$, $BCl_3$ or other suitable semiconductor etchants.

13. The method of claim 8 further comprises the steps of:

depositing material on said semiconductor wafer with a directed energy beam in a first environmentally controlled process chamber;

etching said semiconductor wafer or said deposited material with a directed energy beam in a second environmentally controlled processing chamber; and doping said semiconductor wafer or said deposited material with a directed energy beam in a third substantially environmentally controlled processing chamber.

14. The method of claim 13 wherein said depositing step is before said etching step and said etching step is before said doping step.

* * * * *